US008810142B2

(12) United States Patent

Van Elk et al.

(10) Patent No.: US 8,810,142 B2
(45) Date of Patent: Aug. 19, 2014

(54) WAVEFORM DETECTION AND COMBINED STEP AND LINEAR DIM CONTROL

(75) Inventors: Henricus T. P. J. Van Elk, Ravensteinn (NL); Jeroen Kleinpenning, Lent (NL)

(73) Assignee: NXP B.V., Eindhoven (NL)

( * ) Notice: Subject to any disclaimer, the term of this patent is extended or adjusted under 35 U.S.C. 154(b) by 993 days.

(21) Appl. No.: 12/934,873

(22) PCT Filed: Mar. 27, 2009

(86) PCT No.: PCT/IB2009/051289
§ 371 (c)(1),
(2), (4) Date: Sep. 27, 2010

(87) PCT Pub. No.: WO2009/122334
PCT Pub. Date: Oct. 8, 2009

(65) Prior Publication Data

US 2011/0025228 A1 Feb. 3, 2011

(30) Foreign Application Priority Data

Mar. 31, 2008 (EP) .................................... 08103192

(51) Int. Cl.
*H05B 41/36* (2006.01)
*H03K 17/00* (2006.01)

(52) U.S. Cl.
USPC ....... 315/209 R; 315/291; 315/294; 315/297; 327/407

(58) Field of Classification Search
USPC ............... 315/209 R, 291, 294, 297; 327/407
See application file for complete search history.

(56) References Cited

U.S. PATENT DOCUMENTS

| | | | |
|---|---|---|---|
| 6,043,611 | A | 3/2000 | Gradzki et al. |
| 6,175,195 | B1 | 1/2001 | Janczak et al. |
| 6,452,344 | B1 | 9/2002 | MacAdam et al. |

(Continued)

FOREIGN PATENT DOCUMENTS

| | | | |
|---|---|---|---|
| EP | 1406476 | A2 | 4/2004 |
| EP | 1725085 | A1 | 11/2006 |
| WO | 9846054 | A2 | 10/1998 |
| WO | 0211498 | A1 | 2/2002 |

OTHER PUBLICATIONS

Osram Dulux Product Brochure; 16 Pages.

(Continued)

*Primary Examiner* — Douglas W Owens
*Assistant Examiner* — Jonathan Cooper

(57) ABSTRACT

The present invention relates to a detection circuit (100) capable to detect a rectified phase-cut or sinusoidal waveform using its duty cycle or average value and in response, to select the respective dim mode amongst the linear phase-cut and step-dimming. The circuit (100) receives the rectified waveform with its duty cycle, which is derived through a comparator (22, 24) and converted into a DC signal. The latter which is controlled by the duty cycle is then compared to a reference level (40) through another comparator (20) that, in response, supplies a signal controlling a switching device (30). The switching device (30) will be thus automatically connected either to one set signal level when the DC signal is greater than the reference level (40), namely when the circuit (100) detects a rectified sinusoidal waveform, or to the same level as the DC signal when the DC signal is less than the reference level (40), namely when the circuit (100) detects a rectified phase-cut waveform.

8 Claims, 7 Drawing Sheets

(56) References Cited

U.S. PATENT DOCUMENTS

| | | | | |
|---|---|---|---|---|
| 2002/0140373 | A1 | 10/2002 | Ribarich et al. | |
| 2003/0189411 | A1* | 10/2003 | Sridharan | 315/209 R |
| 2003/0222604 | A1* | 12/2003 | Yao | 315/307 |
| 2004/0056691 | A1* | 3/2004 | Prexl et al. | 327/90 |
| 2004/0061452 | A1* | 4/2004 | Konopka et al. | 315/209 R |
| 2005/0023997 | A1* | 2/2005 | Chitta | 315/307 |
| 2006/0138973 | A1* | 6/2006 | Hirosawa | 315/291 |
| 2006/0158124 | A1* | 7/2006 | Hosaka et al. | 315/82 |
| 2008/0224633 | A1* | 9/2008 | Melanson et al. | 315/292 |
| 2008/0224764 | A1* | 9/2008 | Tan | 327/556 |

OTHER PUBLICATIONS

International Search Report and Written Opinion for Application PCT/IB2009/051289 (March 27, 2009).

* cited by examiner

WAVEFORM DETECTION AND COMBINED STEP AND LINEAR DIM CONTROL

FIELD OF THE INVENTION

The present invention relates to the field of lighting devices, and more particularly to the light-dimming field.

BACKGROUND OF THE INVENTION

Compact Fluorescent Lamps or CFL, commonly referred to as "energy saving" lamps, are energy efficient, consuming up to five times less energy than the conventional incandescent lamps.

For only a few decades ago, light-dimming was only common for incandescent lamps and consisted of switching the current on and off 120 times per second using a solid-state light dimmer, thereby saving energy and allowing the dimmer to be installed in a standard electrical wall-box.

Nowadays, several CFL lamps can also be dimmable, either by means of the same kind of solid-state light dimmer or by means of a so-called step dimmer. The step dimmer is a dimming feature for a CFL lamp where a finite number of dimming states, usually four, can be chosen by means of a certain mains switch ON/OFF sequence.

The present demand from the CFL market is to have a CFL lamp that would be able to function both with step-dimming and linear phase-cut dimming, thus making it much easier to replace any incandescent lamp by such a dimmable CFL lamp. However, the problem is to be able to distinguish between the supply of a "normal" AC mains voltage, namely a voltage having a sinusoidal waveform without phase-cut, and an AC mains voltage through a forward or reverse phase-cut dimmer, namely a phase-cut waveform, thereby making it possible to switch over from a certain fixed dimmed or maximum control value into a continuous dimmer control action, respectively.

SUMMARY OF THE INVENTION

It is therefore an object of the present invention to provide for a circuit capable to detect a rectified phase-cut or sinusoidal waveform and to select the respective dim mode amongst the linear phase-cut dimming and the step-dimming.

This object is achieved by a circuit as claimed in claim 1, a control circuit as claimed in claim 15, a method as claimed in claim 16, a computer program as claimed in claim 18, and an integrated circuit as claimed in claim 19.

In accordance with the embodiments of present invention, there is provided a circuit comprising at least:

- a rectified signal having a property;
- a converter for converting said property into a constant signal;
- a first comparator for comparing said constant signal with a first reference level and providing a first output signal in response to the comparison between said constant signal and said first reference level;
- a first switching device, said first switching device being controlled by said first output signal for switching between either one amongst at least one set signal level or said constant signal.

In embodiments, said property is an average value of said rectified signal, and said converter comprises:

- a low pass filter configured for averaging said rectified signal, and
- a top-clamp circuit.

In embodiments, said top-clamp circuit clamps the first reference level to not exceed a predetermined maximum reference level, in the event of an overvoltage in a mains voltage supplied to said circuit.

In embodiments, said converter further comprises a buffer circuit for buffering said rectified signal and passing a resulting buffered signal to said low pass filter.

In other embodiments, said property is a duty cycle, and said converter is for converting a first duty cycle close to said duty cycle into a constant signal. Thus, in accordance with embodiments of the present invention, there is provided a circuit comprising at least:

- a rectified signal, the rectified signal having a duty cycle;
- a converter for converting a first duty cycle close to the duty cycle into a constant signal; thereby, the first duty cycle can be immune to mains supply variations in order to get a fair representation of the duty cycle of the rectified signal, and the constant or DC signal can be function of the duty cycle;
- a first comparator for comparing the constant signal with a first reference level and providing a first output signal in response to the comparison between the constant signal and the first reference level; thereby, a rectified signal having a rectified phase-cut or sinusoidal waveform can be detected based on the conversion between the duty cycle and the constant signal; and
- a first switching device, the first switching device being controlled by the first output signal for switching between either one amongst at least one set signal level or the constant signal. Thereby, the relevant dim mode can be automatically selected amongst the linear phase-cut dimming and the step-dimming.

Moreover, the first switching device switches between one amongst at least one set signal level when the constant signal is greater than the first reference level and the constant signal when the constant signal is less than the first reference level. Thereby, the linear phase-cut dimming can be selected when the rectified signal has a rectified phase-cut waveform, and the step-dimming can be selected when the rectified signal has a rectified sinusoidal waveform.

The converter may comprise:

- a comparing device for comparing the rectified signal with at least one reference level and providing a comparison signal in response to the comparison between the rectified signal and the at least one reference level, the comparison signal having a set amplitude and a duty cycle equal to the first duty cycle; thereby, the first duty cycle can be derived from the comparison signal that is a square wave signal with a set amplitude and a duty cycle equal to the first duty cycle; and
- an integrating device for integrating the comparison signal and providing an integrated signal from which the constant signal is derived. Thereby, the output of the integrating device can be a constant or DC signal controlled by the first duty cycle close to the duty cycle of the rectified signal.

The integrating device may comprise a low-pass filter. Thereby, ripple in the comparison signal can be smoothed out.

The low-pass filter may also be a switched-capacitor low-pass filter, the switched-capacitor low-pass filter comprising at least a first and second capacitive element and a second and third switching device, the first capacitive element and the second and third switching devices simulating a resistive element, each of the second and third switching devices having a switching sequence controlled by a clock signal. Thereby, a low cut-off frequency can be obtained in order to further attenuate the ripple from the comparison signal, and the clock signal may be derived from the frequency generated in a compact fluorescent lamp (CFL) for example.

The integrating device may additionally comprise a sample and hold circuit for sampling and holding the signal across the second capacitive element. Thereby, an extra low-pass filtering can be created and the integrating device can provide a constant or DC signal.

The comparison signal may be derived from a second output signal provided by a second comparator in response to the comparison between the rectified signal and a second reference level amongst the at least one reference level. Thereby, the rectified signal may have a bridge rectified waveform.

The comparison signal may be further derived from a sum signal generated by a logical sum of the second output signal and a third output signal provided by a third comparator in response to the comparison between the rectified signal and a third reference level amongst the at least one reference level. Thereby, the rectified signal may have a bridge rectified waveform or a voltage-doubler rectified waveform.

In accordance with the present invention, there is also provided a control circuit comprising at least:

a compact fluorescent lamp (CFL); and the circuit according to anyone of the preceding claims.

Thereby, the dimming control of the CFL lamp can be obtained.

In accordance with the present invention, there is provided a method of detecting a rectified phase-cut or sinusoidal waveform, the method comprising:

converting a duty cycle into a constant signal;

comparing the constant signal with a reference level;

providing an output signal in response to the comparison between the constant signal and the reference level; and controlling a switching device through the output signal, the switching device switching between either one amongst at least one set signal level or the constant signal.

In accordance with the present invention, there is also provided a method of selecting a dim mode amongst a linear phase-cut dimming and a step-dimming, the method comprising:

converting a duty cycle into a constant signal;

comparing the constant signal with a reference level;

providing an output signal in response to the comparison between the constant signal and the reference level;

controlling a switching device through the output signal, the switching device switching between one amongst at least one set signal level when the constant signal is greater than the reference level and the constant signal when the constant signal is less than the reference level.

The steps of the previous methods can be carried out by a computer program including program code means, when the computer program is carried out on a computer.

The present invention further extends to an integrated circuit comprising the preceding circuit.

BRIEF DESCRIPTION OF THE DRAWINGS

These and other aspects and advantages of the present invention will be apparent from and elucidated with reference to the embodiment(s) described hereinafter. In the following drawings.

DETAILED DESCRIPTION OF EMBODIMENTS

Figure 1:
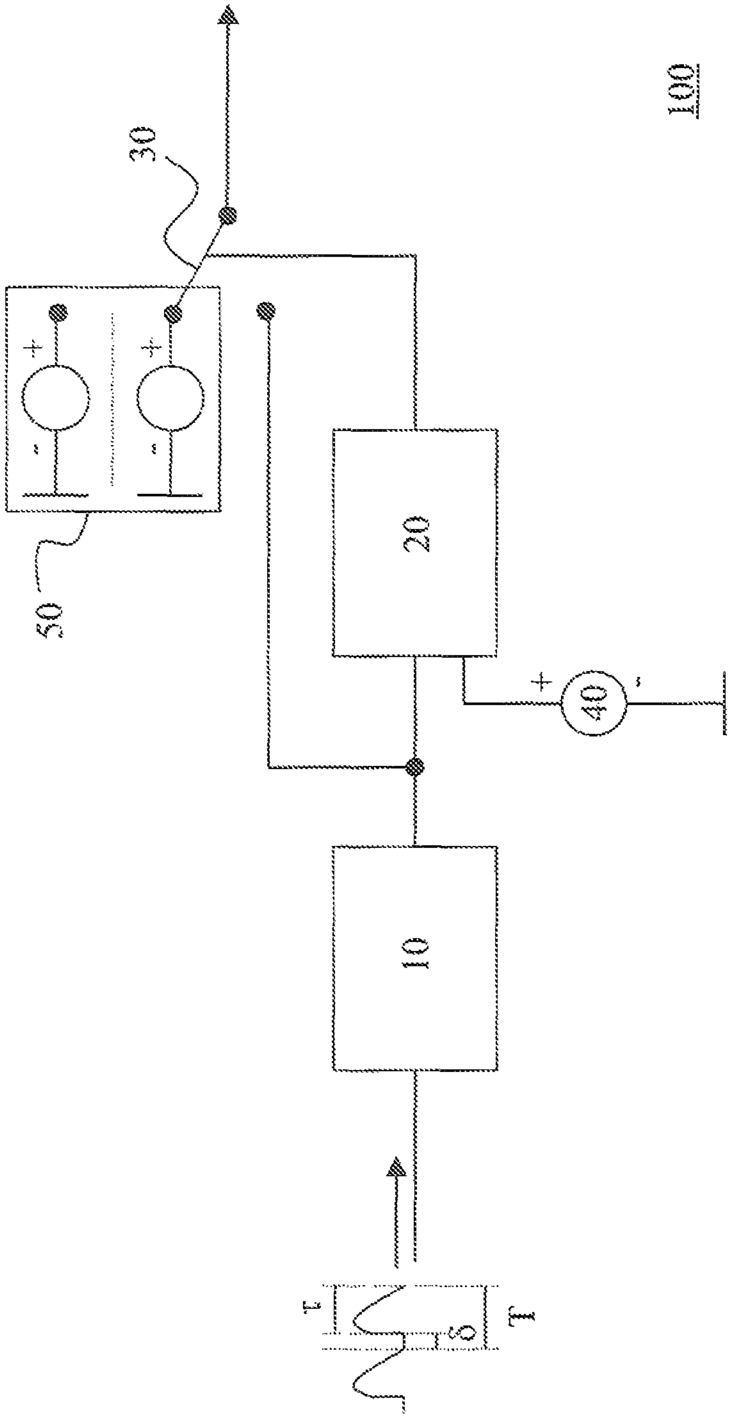
FIG. 1 shows a schematic diagram of a phase-cut dimmer detection circuit according to an embodiment of the present invention, when detecting a rectified signal.

FIG. 1 illustrates a schematic diagram of a phase-cut dimmer detection circuit 100 according to an embodiment of the present invention. The circuit 100 comprises at least a converter 10, a comparator 20, and a switching device 30. The converter 10 is input by a rectified signal with a certain duty cycle D and waveform, the duty cycle D being defined as the ratio $\tau/T$ between the wave duration $\tau$ and the time period T of the waveform, such as depicted in FIG. 1 for a bridge rectified AC mains voltage signal, wherein $\delta$ $(=T-\tau)$ measures the phase-cut duration.

The converter 10 converts a duty cycle D1 close to the duty cycle D into a constant or DC signal, which is compared through the comparator 20 with a fixed DC reference level 40. In response to the comparison between the constant signal and the fixed DC reference level 40, an output signal is output by the comparator 20 for controlling the kind of dimmer, the switching device 30 switching between one amongst several fixed voltage values 50, usually four reference voltage values in a step-dimming configuration, or the constant signal provided by the converter 10 in a phase-cut dimming configuration.

In order to prevent fast toggling of the output signal when both inputs, i.e. the constant signal and the fixed DC reference level 40, are about the same level, the comparator 20 may be a Schmitt trigger, which creates an input hysteresis.

Figure 2:
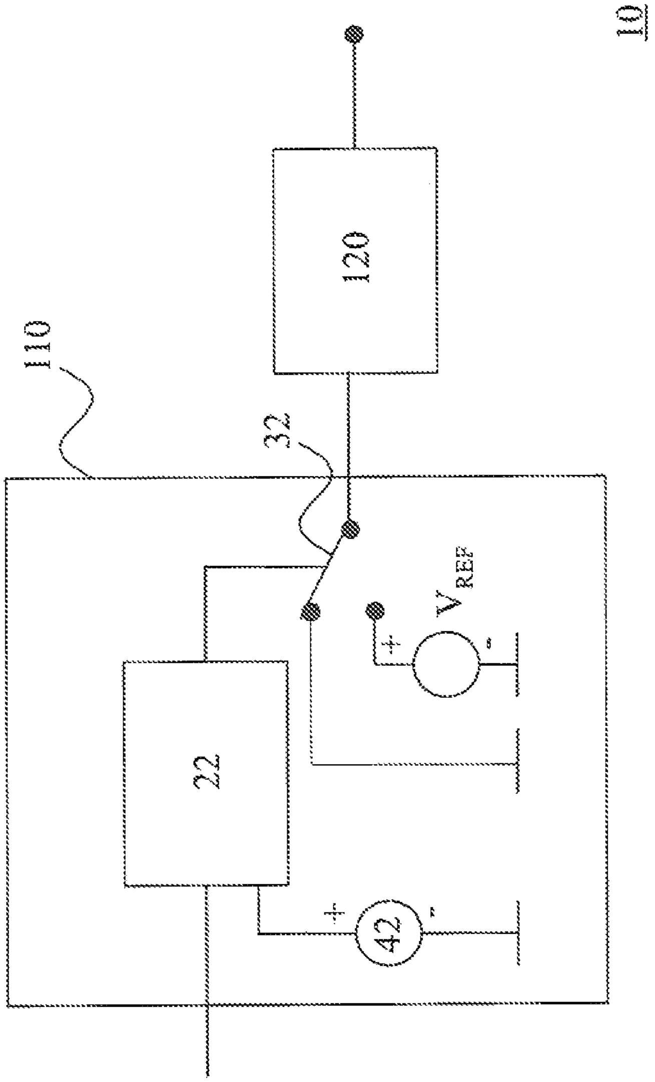
FIG. 2 shows a schematic diagram of the converter 10 of FIG. 1 in the case that the rectified signal is full-wave bridge rectified.

FIG. 2 depicts a schematic diagram of the converter 10 of FIG. 1 in the case that the rectified signal is full-wave bridge rectified. The converter 10 may comprise a comparing device 110 and an integrating device 120.

In the case that the rectified signal is full-wave bridge rectified, the comparing device 110 compares through a comparator 22 the rectified signal with a fixed DC reference level 42 and provides, in response to the comparison between the rectified signal and the reference level 42, a comparison signal having a square waveform with a duty cycle equal to the duty cycle D1. Indeed, the duty cycle D1 is close to the duty cycle D of the rectified signal because the corresponding reference level 42 is chosen to be close to the lowest level of the rectified signal as represented in FIG. 2 in order to be less dependent of mains supply variations and to thus have a rather fair representation of the duty cycle D. The amplitude of the comparison signal can be set to a fixed value $V_{REF}$ using the switching sequence of a switching device 32 between the terminal at $V_{REF}$ and the other one at ground, and the fixed DC reference level 40 can be chosen as being proportional to the fixed value $V_{REF}$.

The integrating device 120 integrates the comparison signal and provides an integrated signal from which derives the constant signal, the integrated signal being linearly controlled by the fixed amplitude value $V_{REF}$ and the duty cycle D1.

In response to the comparison between the constant signal and the fixed DC reference level 40, the step-dimming can be selected when the rectified signal has a rectified sinusoidal waveform, while the linear phase-cut dimming can be selected when the rectified signal has a rectified phase-cut waveform. Indeed, this corresponds to the fact that the switching device 30 will be connected to one amongst the fixed voltage values 50 ($V_{FIXED}$) used in the step dimmer configuration when the constant signal is greater than the fixed DC reference level 40, or connected to the constant signal already present in the phase-cut dimmer when the constant signal is less than the fixed DC reference level 40.

It is to be noted that in the case of a compact fluorescent lamp (CFL), the fixed voltage values 50 may be set at 100% when equal to the reference voltage used for the phase-cut detect comparator. The other values may be derived from this value and be set at 70% and 40% or any other desirable value between 100% and the minimum detectable level (MDL). In a more elaborate version, the minimum detectable level may be adjusted externally. Above $\delta=135°$, it should stay at the externally adjusted min level ($V_{FIXED\text{-}min}$) until the CFL lamp switches off due to a too low phase-cut dimmed mains supply voltage. It is however to be noted that, in practice, the value of $\delta$ for which the MDL should stay at the externally adjusted min level ($V_{FIXED\text{-}min}$) can vary roughly from 90° until 150°.

It is furthermore to be noted that the term phase-cut dimming includes the reverse phase-cut or trailing edge mode dimming and the forward phase-cut or leading edge mode dimming.

Figure 3:
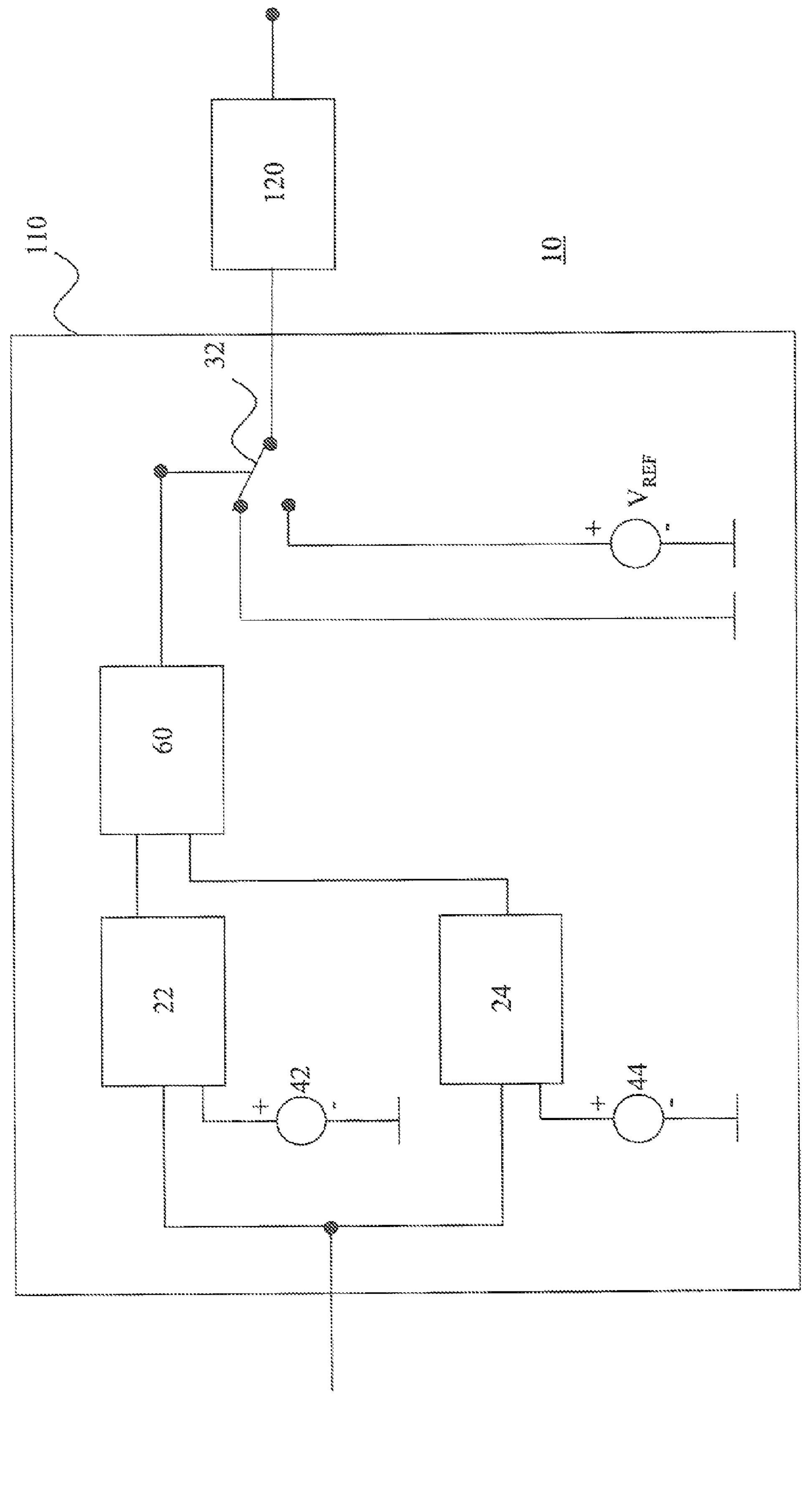
FIG. 3 shows a schematic diagram of the converter 10 of FIG. 1 in the case that the rectified signal is full-wave bridge rectified or voltage-doubler rectified.
Figure 4:
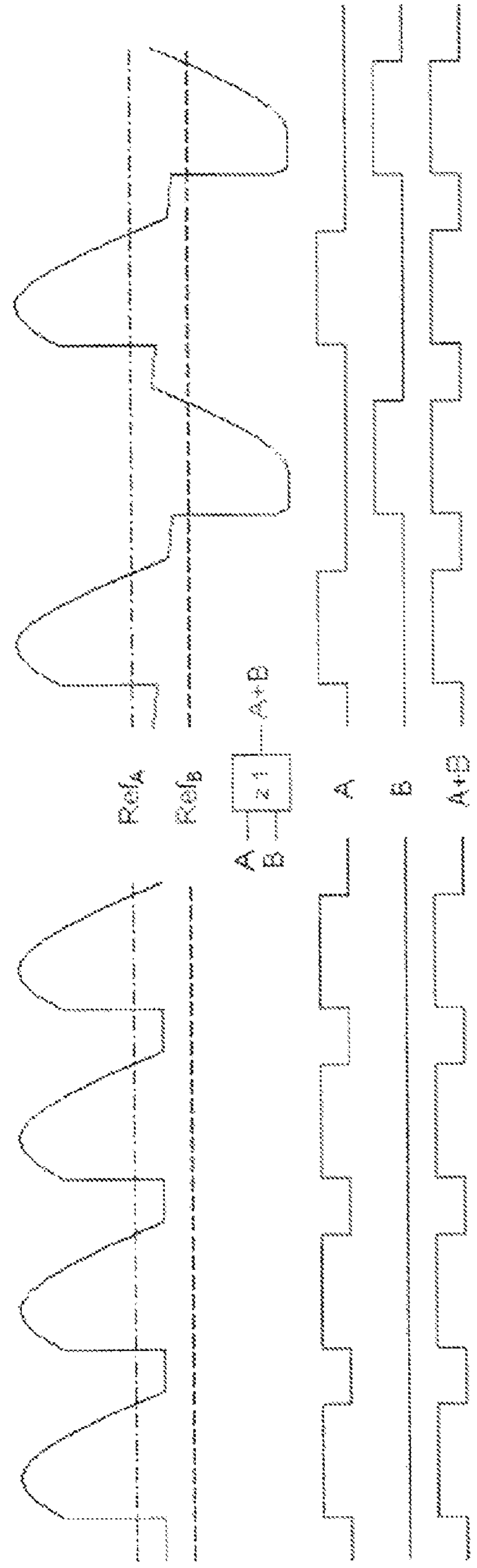
FIG. 4 shows a duty cycle timing diagram for a bridge and voltage-doubler rectified signal when using the converter of FIG. 3.

FIG. 3 shows a schematic diagram of the converter 10 of FIG. 1 in the case that the rectified signal is full-wave bridge rectified or voltage-doubler rectified. In order to detect not only a full-wave bridge rectified signal but also a voltage-doubler rectified signal, an additional comparator 24 with a fixed DC reference level 44 is used by comparison with the schematic diagram of FIG. 2. As illustrated in FIG. 4, the fixed DC reference level 44 (designated as $Ref_B$ in FIG. 4) will be chosen in such a manner that the sum signal, output by an adder 60 and generated by the logical sum (designated as A+B in FIG. 4) of the comparison signal (designated as A in FIG. 4) in response to the comparison between the rectified signal and the fixed DC reference level 42 (designated as $Ref_A$ in FIG. 4) on one hand and the comparison signal (designated as B in FIG. 4) in response to the comparison between the rectified signal and the reference level 44 on the other hand, have the same duty cycle as D1 whatever the rectified signal waveform.

The adder 60 inside the comparing device 110 may consist of a NOR gate, and the integrating device 120 can comprise a low-pass filter 70 that may be realized by a first order RC network or integrator.

In order to allow the load of the low-pass filter 70, a buffer 80 may furthermore be added to the output of the low-pass filter 70.

It is also to be noted that the low-pass filter 70 will be required to have a low enough cut-off frequency $f_0$ for efficiently inhibiting the ripple from the signal at its input to pass through it. Thus, in order to achieve a minimum triangle shaped ripple, the cut-off frequency $f_0$ of the low-pass filter 70 should be 100 times smaller than the frequency f derived from the time period T. In the exemplary case that f=100 Hz (T=10 ms) and the low-pass filter 70 is a RC filter or integrator, this would lead, for an internal on-chip capacitor C of 100 pF and a cut-off frequency $f_0$ of 1 Hz, to a resistor value R of 1.6 GΩ, which is unrealizable for an on-chip resistor. An alternative solution would be to have external elements such as an external capacitor of 100 nF and an external resistor of 1.6 MΩ.

Figure 5:
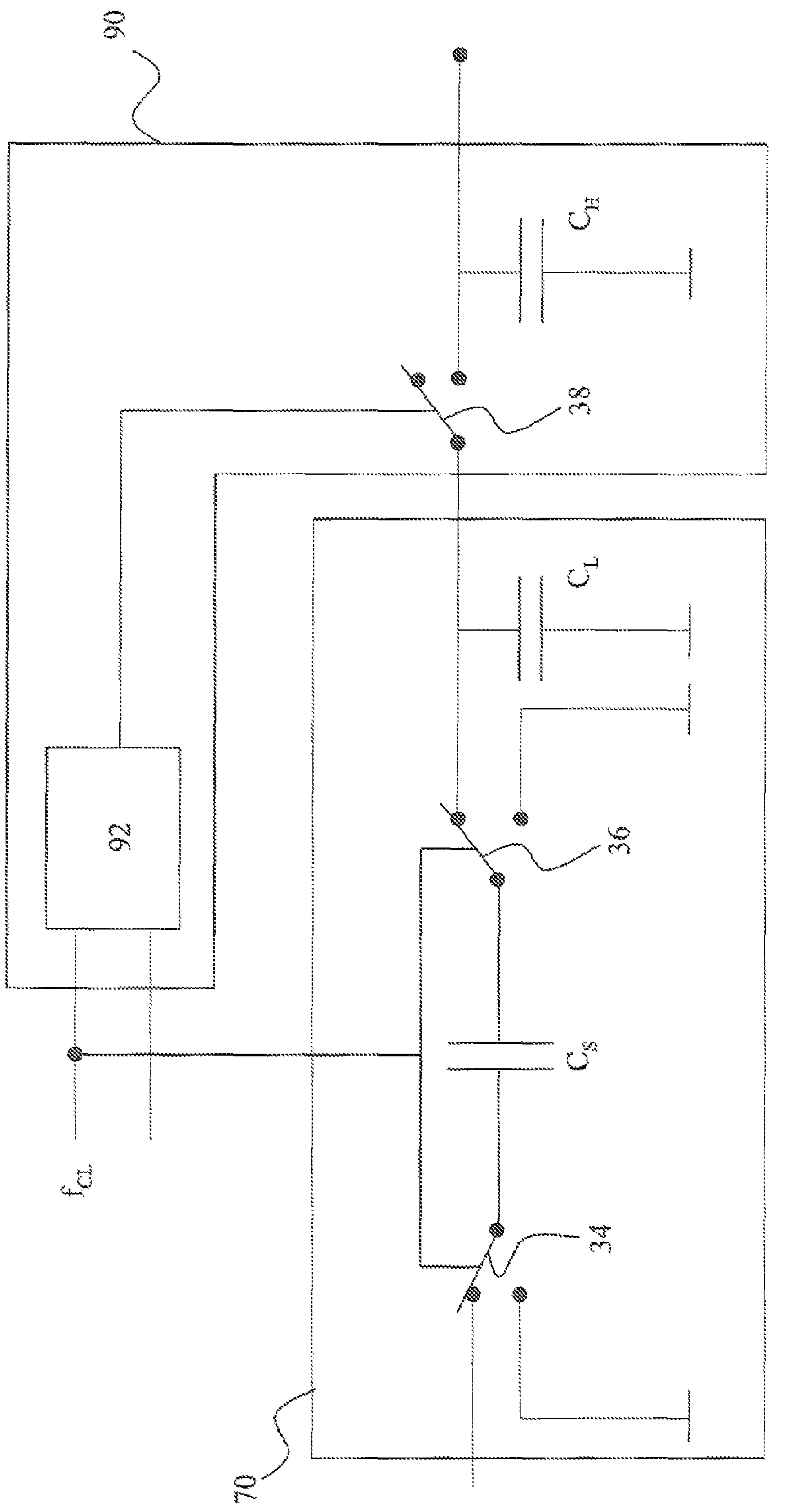
FIG. 5 shows a schematic diagram of the integrating device 120 of FIG. 2 or FIG. 3, using a switched-capacitor low-pass filter with sample and hold circuit.

Therefore, in order to generate a sufficiently low cut-off frequency $f_0$, the low-pass filter 70 may be advantageously replaced by a switched-capacitor low-pass filter ($C_S$, $C_L$, 34, 36) such as shown in FIG. 5, wherein the two switching devices 34, 36 have a switching sequence controlled by a clock signal $f_{CL}$ and simulate, together with the capacitive element $C_S$, a resistive element $R_{eq}=1/(f_{CL}\cdot C_S)$, wherein $f_{CL}=f_{lamp}/32$ if the clock signal $f_{CL}$ corresponds to the frequency $f_{lamp}$ of the compact fluorescent lamp (CFL) divided by 32. In this configuration, the cut-off frequency $f_0$ of the switched-capacitor low-pass filter becomes: $f_0=1/(2\cdot\pi\cdot R_{eq}\cdot C_L)$, or otherwise expressed: $f_0=f_{CL}\cdot C_S/(2\cdot\pi\cdot C_L)$. Thus, for a CFL lamp frequency of 50 kHz, this would lead to an $f_{CL}$ of 1562.5 Hz and $C_S$=0.4 pF with $C_L$=100 pF and $f_0$=1 Hz. By using a matrix of several smaller capacitive elements, a fairly accurate $C_L/C_S$ ratio can be made. Under these conditions, the maximum ripple on the output is low and equal to $f_{CL}\cdot C_S/(2\cdot f_{duty\text{-}cycle}\cdot C_L)=0.03\cdot V_{REF}$.

The "Divide by 32" circuitry 72 to derive $f_{CL}$ from the lamp frequency can be realized by an asynchronous 5-bit counter using a chain of five D-type flip-flops (DFF) and used as a frequency divider. It is to be noted that the "Divide by 32" circuitry 72 can also be realized by a synchronous counter, which however requires more logic gates in realization.

In order to improve the filtering for obtaining a constant signal during the time period T, a sample and hold (S&H) circuit 90 behind the capacitive element $C_L$ consisting of a capacitive element $C_H$, a switching device 38 and a S&H logic circuit 92 may be added as depicted in FIG. 5, wherein the data input of the S&H logic circuit 92 is driven by the logic output of the comparator 22 or 60 of the comparing device 110. It creates an extra low-pass filtering when the sample and hold switch is closed at the moment the capacitive element $C_S$ is connected to ground (GND). The filtering time constant depends on the $C_L/C_H$ ratio and the sample clock frequency applied at the clock input of the S&H logic circuit 92, which is the frequency f derived from the time period T. For example, if $C_L/C_H$=2, the cut-off frequency $f_0$ is about 16 Hz when f=100 Hz (T=10 ms). It is also to be noted that the complete logic part may be clocked asynchronous to economize on the amount of logic gates.

Figure 6:
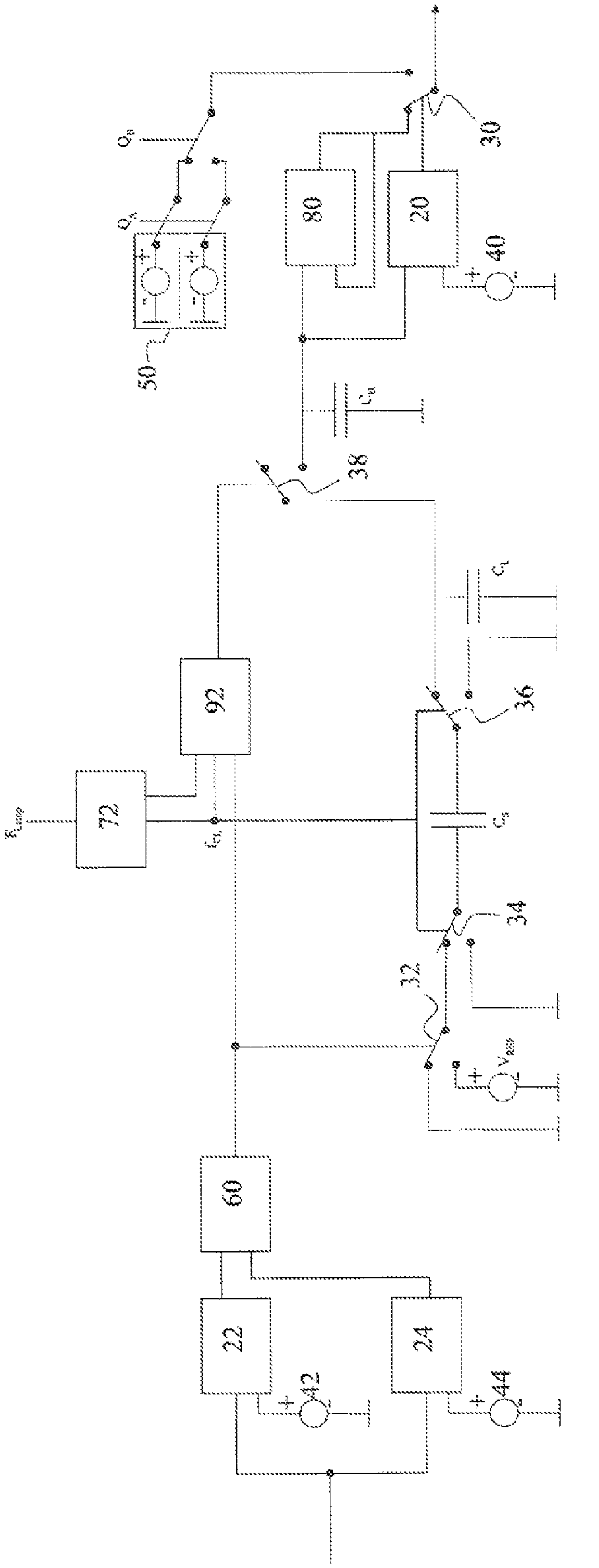
FIG. 6 shows a detailed representation of the phase-cut dimmer detection circuit of FIG. 1 according to an embodiment of the present invention, when detecting a rectified signal.

FIG. 6 gives a detailed representation of the phase-cut dimmer detection circuit of FIG. 1 according to an embodiment of the present invention, when detecting a rectified signal. In this embodiment, both input comparators 22, 24, have been expanded with a hysteresis input to minimize the influence of mains ripple present on the voltage-doubler rectified signal. For step dimming, four reference voltage values are shown with switching devices controlled by logic signals $Q_A$ and $Q_B$.

Figure 7:
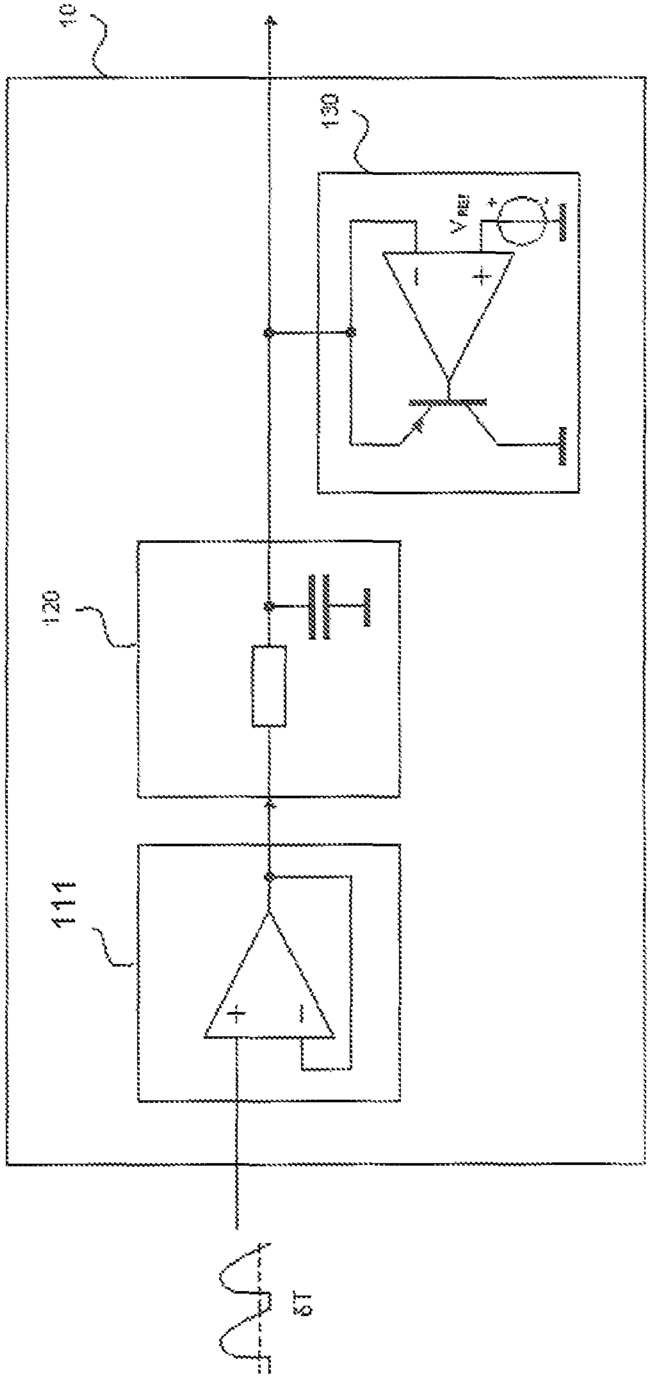
FIG. 7 shows a schematic diagram of an alternative implementation of a converter 10.

In FIG. 7 is shown a convertor according to an alternative embodiment of the invention which operates by using an average value of the rectified input signal. The figure shows an alternative configuration for converter 10. In this embodiment, converter 10 may comprise a buffer circuit 111, followed by a low pass filter 70: the low pass filter 70 has the effect of averaging of the rectified input signal. Low pass filter 70 is followed by a top-clamp circuit 130. Top clamp circuit acts on the reference voltage $V_{REF}$ to prevent it from exceeding a maximum level in case of an over-voltage in the mains supply. The top clamp circuit is a conventional circuit which operates by means of a transistor-rectified closed loop feedback-loop high gain differential amplifier, acting on the reference voltage $V_{REF}$.

In a further alternative embodiment, the buffer circuit 111 may be omitted entirely, and the rectifier input signal may be fed directly to the low pass filter 70.

Further circuitry may be provided in order to ensure that the rectified input signal, when a phase-cut signal, is appropriately attenuated such that for nominal mains voltage (for example 230V AC, full sine wave without phase-cut), it becomes equal to the reference voltage $V_{REF}$. Thus in contrast to the embodiments which include duty cycle control—which are almost completely independent of mains voltage variations—embodiments such as that illustrated in FIG. 7, which involve average value control, are not independent of mains voltage variations. So, to keep the low pass filtered control signal within limits, a top clamp is added. This top clamp should be active as soon as the mains supply is above its nominal value (230V AC, full sine wave without phase cut). A double sided rectified signal has an average value of 207V DC, a single side rectified signal about 103.5 V DC. These values are typically far too large as input signals and thus have to be attenuated to the $V_{REF}$ value which can be, for example, as low as 1V.

Applications contemplated for such circuit 100 include dimmable lighting applications, and in particular the enhanced compact fluorescent lamp control.

In summary, a detection circuit 100, capable to detect a rectified phase-cut or sinusoidal waveform using its duty cycle or average value and in response, to select the respective dim mode amongst the linear phase-cut and step-dimming, has been described. The circuit 100 receives the rectified waveform with its duty cycle, which is derived through a comparator 22, 24 and converted into a DC signal. The latter which is controlled by the duty cycle is then compared to a reference level 40 through another comparator 20 that, in response, supplies a signal controlling a switching device 30. The switching device 30 will be thus automatically connected either to one set signal level when the DC signal is greater than the reference level 40, namely when the circuit 100 detects a rectified sinusoidal waveform, or to the same level as the DC signal when the DC signal is less than the reference level 40, namely when the circuit 100 detects a rectified phase-cut waveform.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single or other unit may fulfil the functions of several items recited in the claims. The mere fact that certain measures are recited in mutually different dependent claims does not indicate that a combination of these measured cannot be used to advantage.

A computer program may be stored/distributed on a suitable medium, such as an optical storage medium or a solid-state medium supplied together with or as part of other hardware, but may also be distributed in other forms, such as via the Internet or other wired or wireless telecommunication systems.

Any reference signs in the claims should not be construed as limiting the scope.

The invention claimed is:

1. A circuit comprising:

a rectified signal having a property, said property being a duty cycle;

a converter for converting a first duty cycle close to said duty cycle into a constant signal;

a first comparator for comparing said constant signal with a first reference level and providing a first output signal in response to the comparison between said constant signal and said first reference level:

wherein the first comparator is configured to have an input hysteresis, thereby preventing fast toggling of the first output signal when the constant signal and the first reference level are about the same level;

a first switching device, said first switching device being controlled by said first output signal for switching between either one amongst at least one set signal level or said constant signal;

wherein said converter comprises:

a comparing device for comparing said rectified signal with at least one reference level and providing a comparison signal in response to the comparison between said rectified signal and said at least one reference level, said comparison signal having a set amplitude and a duty cycle equal to said first duty cycle;

an integrating device for integrating said comparison signal and providing an integrated signal from which said constant signal is derived;

wherein said comparison signal is derived from a second output signal provided by a second comparator in response to the comparison between said rectified signal and a second reference level amongst said at least one reference level and further said comparison signal is derived from a sum signal generated by a logical sum of said second output signal and a third output signal provided by a third comparator in response to the comparison between said rectified signal and a third reference level amongst said at least one reference level.

2. The circuit according to claim 1, wherein said converter further comprises a buffer circuit for buffering said rectified signal and passing a resulting buffered signal to said low pass filter.

3. The circuit according to claim 1, wherein said integrating device comprises a low-pass filter.

4. The circuit according to claim 3, wherein said low-pass filter is a switched-capacitor low-pass filter, said switched-capacitor low-pass filter comprising at least a first and second capacitive element and a second and third switching device, said first capacitive element and said second and third switching devices simulating a resistive element, each of said second and third switching devices having a switching sequence controlled by a clock signal.

5. The circuit according to claim 4, wherein said integrating device further comprises:

a sample and hold circuit for sampling and holding a signal across said second capacitive element.

6. The circuit according to claim 1, wherein said rectified signal is rectified by a bridge rectifier or a voltage-doubler rectifier.

7. A control circuit comprising at least:

a compact fluorescent lamp;

the circuit according to claim 1.

8. An integrated circuit comprising a circuit as claimed in claim 1.

* * * * *